United States Patent [19]

Manabe et al.

[11] Patent Number: 5,408,120
[45] Date of Patent: Apr. 18, 1995

[54] LIGHT-EMITTING DEVICE OF GALLIUM NITRIDE COMPOUND SEMICONDUCTOR

[75] Inventors: Katsuhide Manabe; Masahiro Kotaki; Makoto Tamaki, all of Inazawa; Masafumi Hashimoto, Nagoya, all of Japan

[73] Assignees: Toyoda Gosei Co., Ltd., Nishikasugai; Kabushiki Kaisha Toyota Chuo Kenkyusho, Aichi, both of Japan

[21] Appl. No.: 6,301

[22] Filed: Jan. 22, 1993

[30] Foreign Application Priority Data

Jul. 23, 1992 [JP] Japan .................. 4-218595

[51] Int. Cl.$^6$ ............... H01L 27/14; H01L 31/00; H01L 29/00; H01L 49/00
[52] U.S. Cl. ..................... 257/431; 257/11; 257/21; 257/22; 257/76; 257/94; 257/103; 257/189; 257/453; 257/613; 257/615; 257/745; 257/766
[58] Field of Search ............ 257/431, 103, 76, 94, 257/189, 200, 201, 86, 613, 615, 21, 22, 11, 453, 745, 766

[56] References Cited

U.S. PATENT DOCUMENTS

| | | | |
|---|---|---|---|
| 3,783,353 | 1/1974 | Pankove | 317/235 R |
| 4,153,905 | 5/1979 | Charmakadze et al. | 257/30 |
| 4,158,849 | 6/1979 | Harwyld | 357/16 |
| 4,268,842 | 5/1981 | Jacob et al. | 257/76 |
| 4,297,717 | 10/1981 | Li | 357/15 |
| 4,396,929 | 8/1983 | Ohki et al. | 257/76 |
| 4,408,217 | 10/1983 | Kobayashi et al. | 257/76 |
| 4,473,938 | 10/1984 | Kobayashi et al. | 437/127 |
| 4,608,581 | 8/1986 | Bagratishvili et al. | 257/76 |
| 4,614,961 | 9/1986 | Khan et al. | 257/453 |
| 4,855,249 | 8/1989 | Akasaki et al. | 437/81 |
| 4,911,102 | 3/1990 | Manabe et al. | 118/719 |
| 4,946,548 | 8/1990 | Kotaki et al. | 156/643 |
| 5,005,057 | 4/1991 | Izumiya et al. | 257/13 |
| 5,006,908 | 4/1991 | Natsuoka et al. | 257/76 |
| 5,182,670 | 6/1993 | Khan et al. | 359/359 |

FOREIGN PATENT DOCUMENTS

| | | |
|---|---|---|
| 277597 | 8/1988 | European Pat. Off. |
| 0444630 | 9/1991 | European Pat. Off. |
| 2738329 | 3/1978 | Germany. |
| 3046018 | 9/1981 | Germany. |
| 54-71589 | 8/1979 | Japan. |
| 54-71590 | 8/1979 | Japan. |
| 56-59699 | 5/1981 | Japan. |
| 57-87184 | 5/1982 | Japan. |
| 57-153479 | 9/1982 | Japan. |
| 57-153479 | 9/1982 | Japan. |
| 57-46669 | 10/1982 | Japan. |
| 58-12381 | 1/1983 | Japan. |
| 58-46686 | 3/1983 | Japan. |
| 61-7671 | 1/1986 | Japan. |
| 62-119196 | 5/1987 | Japan. |
| 63-188977 | 8/1988 | Japan. |
| 2-81482 | 3/1990 | Japan. |
| 2-81483 | 3/1990 | Japan. |
| 2-81484 | 3/1990 | Japan. |
| 1589351 | 5/1981 | United Kingdom. |

OTHER PUBLICATIONS

Boulou et al, "Light Emitting Diodes Based On GaN", Philips Tech. Rev., 37, 237–240 No. 9/10, 1977.
Patent Abstract of Japan, vol. 5 No. 145 (E–74)(817) Sep. 1981 re JP-A-5679482.
Patent Abstract of Japan, vol. 4, No. 36 (E–3) Jul. 1978 re JP-A 55009442.
U.S. application Ser. No. 7,926,022, Jan. 1994, Manabe et al.
U.S. application Ser. No. 7,708,883, Apr. 1993, Kotaki et al.
U.S. application Ser. No. 7,781,913, Jan. 1994, Kotaki et al.

Primary Examiner—Andrew J. James
Assistant Examiner—Teresa Maria Arroyo
Attorney, Agent, or Firm—Cushman, Darby & Cushman

[57] ABSTRACT

A light-emitting diode of GaN compound semiconductor emits a blue light from a plane rather than dots for improved luminous intensity. This diode includes a first electrode associated with a high-carrier density n$^+$ layer and a second electrode associated with a high-impurity density $i_H$-layer. These electrodes are made up of a first Ni layer (110 Å thick), a second Ni layer (1000 Å thick), an Al layer (1500 Å thick), a Ti layer (1000 Å thick), and a third Ni layer (2500 Å thick). The Ni layers of dual structure permit a buffer layer to be formed between them. This buffer layer prevents the Ni layer from peeling. The direct contact of the Ni layer with GaN lowers a drive voltage for light emission and increases luminous intensity.

14 Claims, 8 Drawing Sheets

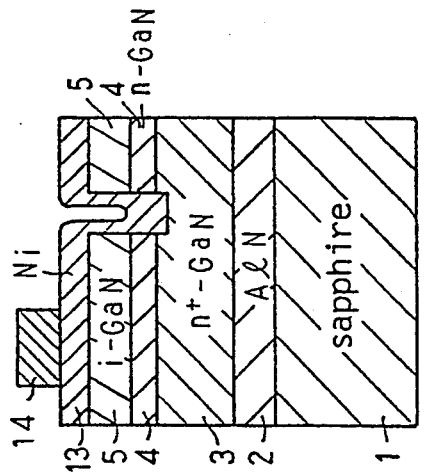
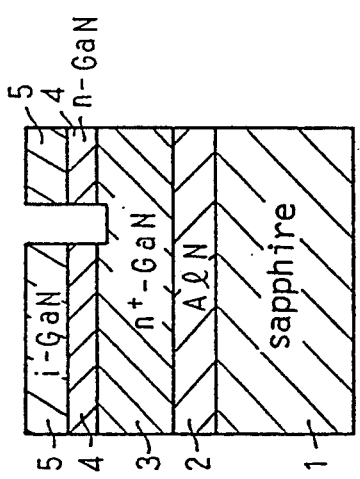
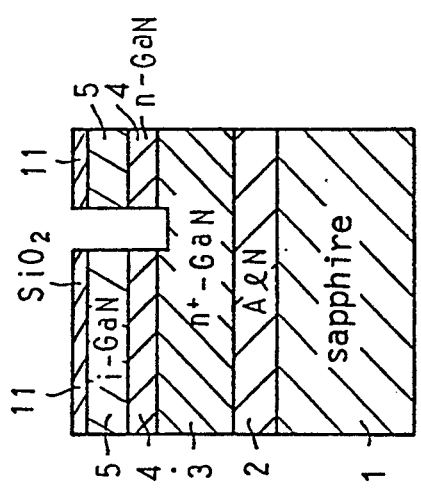
FIG. 3 (a)
FIG. 3 (b)
FIG. 3 (c)

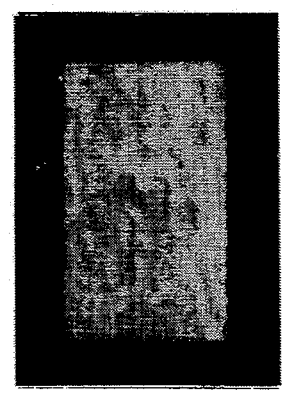
FIG. 5(b) (×120) Ni
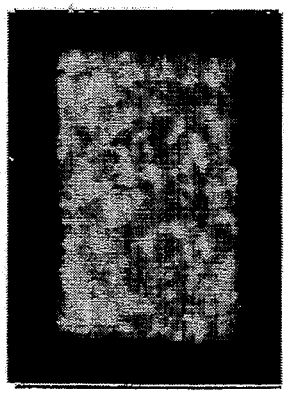
FIG. 5(d) (×120) Ti
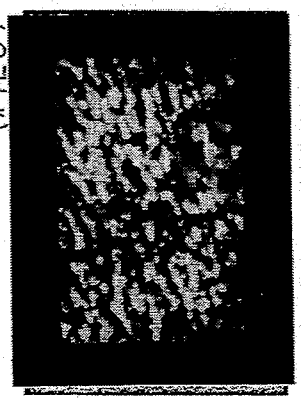
FIG. 5(a) (×120) Aℓ
FIG. 5(c) (×120) Ag

LIGHT-EMITTING DEVICE OF GALLIUM NITRIDE COMPOUND SEMICONDUCTOR

BACKGROUND OF THE INVENTION

1. Field of the Invention

The present invention relates to a light-emitting device of gallium nitride compound semiconductor which emits a blue light.

2. Description of the Prior Art

Among the conventional light-emitting diodes which emit a blue light is the gallium nitride compound semiconductor. It attracts attention because of its high luminous efficiency resulting from the direct transition and its ability to emit a blue light, one of the three primary colors of light.

The light-emitting diode of gallium nitride compound semiconductor is made up of a sapphire substrate, an n-layer grown on the substrate from a GaN compound semiconductor of n-type conduction, with or without a buffer layer of aluminum nitride interposed between them, and an i-layer grown on the n-layer from a GaN compound semiconductor which is made i-type by doping with a p-type impurity. (Japanese Patent Laid-open Nos. 119196/1987 and 188977/1988)

It is known that the above-mentioned light-emitting diode will be improved in luminous intensity when the i-layer is provided with an electrode of large area because light emission takes place directly under or near the i-layer.

Much has been reported on the study of crystal growth for light-emitting diodes of GaN compound semiconductors. However, only a little has been reported on the process of producing such light-emitting diodes. This is true particularly of the electrode for the i-layer in a light-emitting diode having a MIS (metal insulator semiconductor) structure. It has been disclosed only in Japanese Patent Laid-open No. 46669/1982, and nothing has so far been discussed about how the electrode for the i-layer is associated with light emission.

The electrode for the i-layer has the layer structure as shown in vertical section in FIG. 8 which is a reproduction from the Japanese patent just given above. Referring to FIG. 8, there is shown a light-emitting diode 60, which has an electrode 67 for the i-layer and an electrode 68 for the n-layer. The electrode 67 is formed from nickel deposited on an aluminum substrate deposited directly on the i-layer. The electrode 68 is also formed from nickel deposited on an aluminum substrate deposited in a hole penetrating the i-layer.

A disadvantage of forming the electrode on aluminum in direct contact with the i-layer is that light is emitted from coarse dots rather than a uniform plane, as shown in FIG. 5(a). The resulting light-emitting diode does not have increased luminous intensity despite its large light-emitting area.

SUMMARY OF THE INVENTION

The present invention was completed to address the above-mentioned problem. It is an object of the present invention to provide a light-emitting diode of GaN compound semiconductor which emits a blue light from a plane, rather than dots, to improve luminous intensity.

The present invention is embodied in a light-emitting device of gallium nitride compound semiconductor having an n-layer of n-type gallium nitride compound semiconductor ($Al_xGa_{1-x}N$, $x \geq 0$) and an i-layer of i-type gallium nitride compound semiconductor ($Al_xGa_{1-x}N$, $x \geq 0$) doped with a p-type impurity, characterized in that said i-layer has a Ni layer in contact therewith which functions as an electrode therefor.

The present invention is also embodied in a light-emitting device of gallium nitride compound semiconductor as defined above, wherein the n-layer has a Ni layer in contact therewith which functions as an electrode therefor.

The present invention is also embodied in a light-emitting device of gallium nitride compound semiconductor material as defined above, wherein the electrode for the i-layer is of multi-layer structure composed of a first Ni layer (which is thin), a second Ni layer (which is thicker than the first Ni layer), an Al layer, a Ti layer, and a third Ni layer (which is thick), all of which are arranged upward in the order mentioned.

The present invention is also embodied in a light-emitting device of gallium nitride compound semiconductor material having an n-layer of n-type gallium nitride compound semiconductor ($Al_xGa_{1-x}N$, $x \geq 0$) material and an i-layer of i-type gallium nitride compound semiconductor ($Al_xGa_{1-x}N$, $x \geq 0$) material doped with a p-type impurity, characterized in that the n-layer and i-layer have their respective electrodes on the same surface, with the electrode for the n-layer being made of Al or an alloy containing Al, and the electrode for the i-layer being made of Ni, Ag, or Ti, or an alloy containing any of them.

According to the present invention, the electrode for the i-layer is in contact with the i-layer through a Ni layer. This structure permits the light-emitting device to emit light from a plane rather than dots, which leads to improved luminous intensity. In addition, it decreases the driving voltage, alleviating thermal degradation and improving reliability.

In the present invention, the nickel electrode for the n-layer only slightly increases the driving voltage for light emission and it poses no problems (normally associated with a decrease in luminous intensity) even when it is made in the same structure as the electrode for the i-layer. Making the electrodes for both the n-layer and i-layer from nickel simplifies the production of the light-emitting diode.

According to the present invention, the electrode is of multi-layer structure composed of a first Ni layer (which is thin), a second Ni layer (which is thicker than the first Ni layer), an Al layer, a Ti layer, and a third Ni layer (which is thick). This produces the following two effects.

(1) Forming a first Ni layer (which is thin) directly on the i-layer and a second Ni layer (which is thick) subsequently permits a thermal stress buffer layer to be formed between the two Ni layers, and it prevents the peeling of the Ni layers due to thermal expansion and contraction at the time of soldering and reflowing.

(2) The formation of an Al layer, a Ti layer, and a third Ni layer on the second Ni layer permits the electrode to be connected by soldering.

According to the present invention, the n-layer and i-layer have their respective electrodes on the same surface, with the electrode for the n-layer being made of Al or an alloy containing Al, and the electrode for the i-layer having a lower layer made of Ni, Ag, or Ti, or an alloy containing any of them and a higher layer made of Al or an alloy containing Al. This structure permits the light-emitting diode to emit light from a plane rather than dots.

BRIEF DESCRIPTION OF THE DRAWINGS

FIGS. 2(A) to 4(C) are vertical sectional views showing the steps of producing the light-emitting diode pertaining to the first embodiment of the present invention.

FIGS. 5(A) to 5(d) are photomicrographs showing the metal surface structure (as the light-emitting pattern) of each substrate metal of the electrode for the i-layer.

DESCRIPTION OF THE PREFERRED EMBODIMENTS

Example 1

Figure 1:
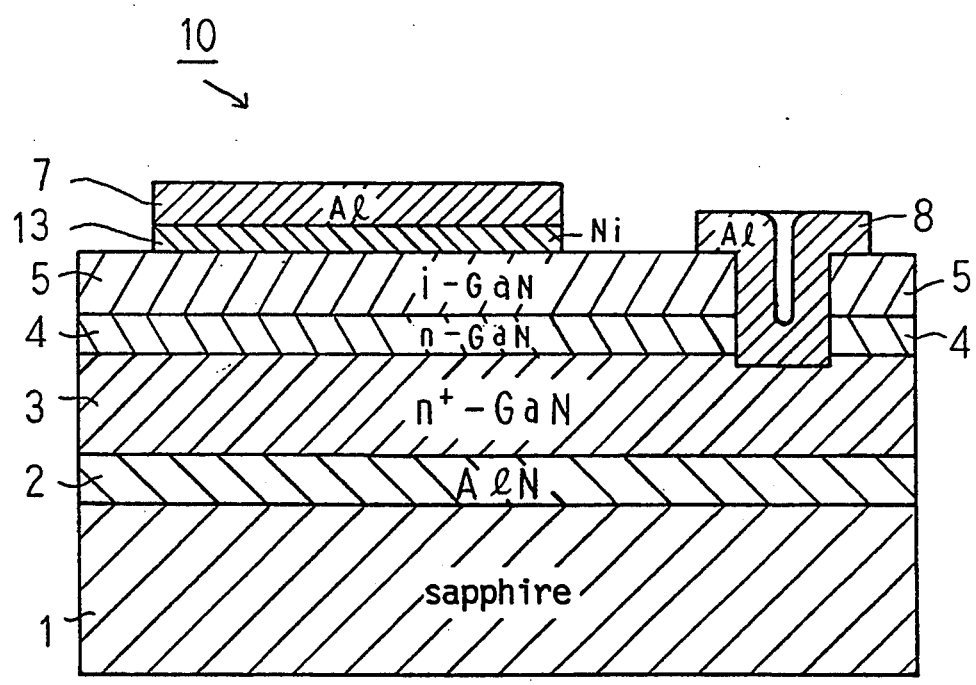
FIG. 1 is a vertical sectional view showing the structure of the light-emitting diode pertaining to first embodiment of the present invention.
Figure 2:
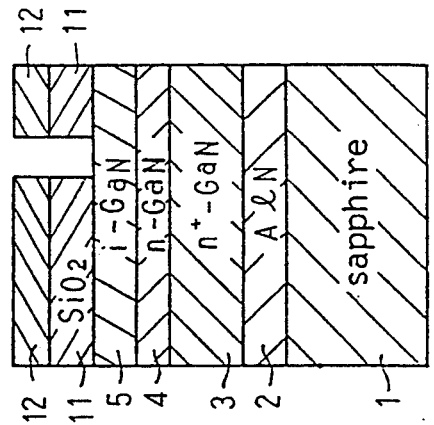
Figure 2:
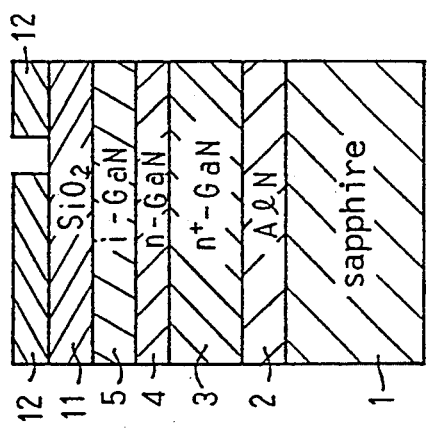
Figure 2:
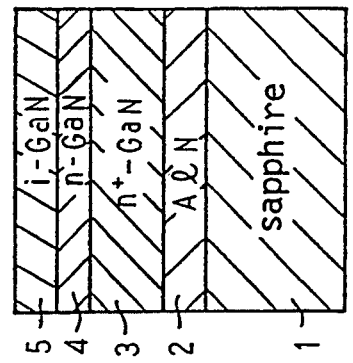
Figure 4:
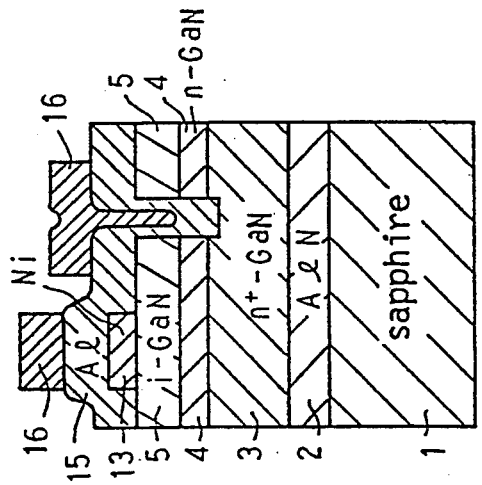
Figure 4:
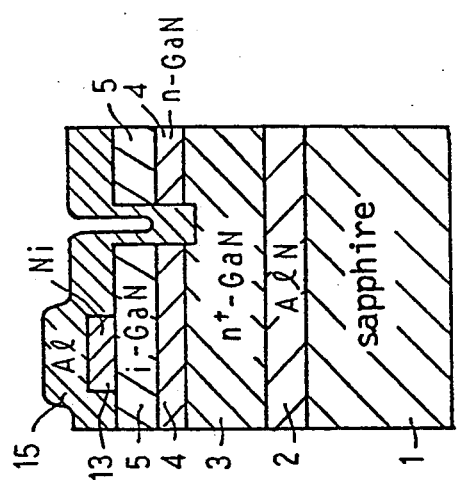
Figure 4:
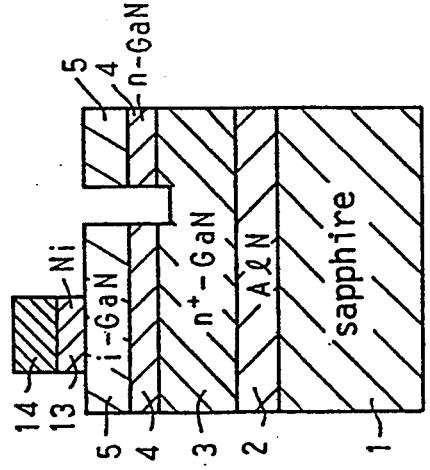

The present invention will be described in more detail with reference to a first disclosed embodiment. FIG. 1 shows a vertical section of a light-emitting diode 10 pertaining to the present invention. It has a sapphire substrate 1, on which there are successively formed a buffer layer 2 of AlN (500 Å thick), a high-carrier density n+-layer 3 of GaN (2.2 μm thick), a low-carrier density n-layer 4 of GaN (1.5 μm thick), an i-layer 5 of GaN (0.1 μm thick), an electrode 7 of aluminum, and an electrode 8 of aluminum (in contact with the high-carrier density n+-layer 3).

This light-emitting diode 10 is produced by the steps which are explained below with reference to FIGS. 2(A) to 4(C).

The entire process was carried out using $NH_3$, $H_2$ (carrier gas), trimethyl gallium $Ga(CH_3)_3$ (TMG for short), trimethyl aluminum $Al(CH_3)_3$ (TMA for short), silane $SiH_4$ and diethyl zinc (DEZ for short).

Firstly, sapphire substrate 1 of single crystal (with the a-plane (i.e., {11$\bar{2}$0} as the principal plane) was cleaned by washing with an organic solvent and by subsequent heat treatment. Then, it was placed on the susceptor in the reaction chamber for metal-organic vaporphase epitaxy (MOVPE). $H_2$ was fed to the reaction chamber under normal pressure at a flow rate of 2 L/min to perform vapor phase etching on the sapphire substrate 1 at 1100° C.

With the temperature lowered to 400° C., the reaction chamber was supplied with $H_2$, $NH_3$, and TMA at a flow rate of 20 L/min, 10 L/min, and $1.8 \times 10^{-5}$ mol/min, respectively, to form the buffer layer 2 of AlN (500 Å thick).

With the temperature of the sapphire substrate 1 kept at 1150° C., the reaction chamber was supplied with $H_2$, $NH_3$, TMG, and $SiH_4$ (diluted to 0.86 ppm with $H_2$) at a flow rate of 20 L/min, 10 L/min, $1.7 \times 10^{-4}$ mol/min, and 200 mL/min, respectively, for 30 minutes to form the high-carrier density n+-layer 3 of GaN (2.2 μm thick), with a carrier density of $1.5 \times 10^{18}/cm^3$.

With the temperature of the sapphire substrate 1 kept at 1150° C., the reaction chamber was supplied with $H_2$, $NH_3$, and TMG at a flow rate of 20 L/min, 10 L/min, and $1.7 \times 10^{-4}$ mol/min, respectively, for 20 minutes to form the low-carrier density n-layer 4 of GaN (1.5 μm thick), with a carrier density of $1 \times 10^{15}/cm^3$.

With the temperature of the sapphire substrate 1 kept at 900° C., the reaction chamber was supplied with $H_2$, $NH_3$, TMG, and DEZ at a flow rate of 20 L/min, 10 L/min, $1.7 \times 10^{-4}$ mol/min, and $1.5 \times 10^{-4}$ mol/min, respectively, for 1 minute to form the i-layer 5 of GaN (0.1 μm thick).

In this way there was obtained the multi-layer structure as shown in FIG. 2(a).

On the i-layer 5 was formed the $SiO_2$ layer 11 (2000 Å thick) by sputtering, as shown in FIG. 2(b). The $SiO_2$ layer 11 was coated with a photoresist 12, which was subsequently patterned by photolithography after the configuration of the electrode for the high-carrier density n+-layer 3. The exposed part of the $SiO_2$ layer 11 was removed by etching with hydrofluoric acid, as shown in FIG. 2(c). The exposed part of the i-layer 5, the underlying part of the low-carrier density n-layer 4, and the underlying upper part of the high-carrier density n+-layer 3 were removed by dry etching with $BCl_3$ gas fed at a flow rate of 10 mL/min at 0.04 Torr in conjunction with a high-frequency power of 0.44 W/cm², followed by Ar dry etching, as shown in FIG. 3(A). The $SiO_2$ layer 11 remaining on the i-layer 5 was removed with the aid of hydrofluoric acid, as shown in FIG. 3(B).

With the temperature kept at 225° C. and the degree of vacuum kept at $8 \times 10^{-7}$ Torr, the sample was entirely coated with the Ni layer 13 (3000 Å thick) by vapor deposition, as shown in FIG. 3(C). The Ni layer 13 was coated with a photoresist 14, which was subsequently patterned by photolithography after the configuration of the electrode for the i-layer 5.

The unmasked part of the Ni layer 13 was etched off using nitric acid and the photoresist 14 was removed by acetone, so that the Ni layer 13 partly remained on which the electrode for the i-layer 5 was formed afterward, as shown in FIG. 4(A).

With the temperature kept at 225° C. and the degree of vacuum kept at $8 \times 10^{-7}$ Torr, the sample was entirely coated with the Al layer 15 (3000 Å thick) by vapor deposition, as shown in FIG. 4(B).

The Al layer 15 was coated with a photoresist 16, which was subsequently patterned by photolithography after the configuration of the respective electrodes for the high-carrier density n+-layer 3 and the i-layer 5, as shown in FIG. 4(C).

The exposed part of the Al layer 15 was etched off using nitric acid and the remaining photoresist 16 was removed by acetone, Thus there were formed the electrode 7 for the i-layer 5 and the electrode 8 for the high-carrier density n+-layer 3.

In this way there was obtained the GaN light-emitting device of MIS structure as shown in FIG. 1.

Incidentally, the undercoating layer 13 on the i-layer 5 may be formed from Ag or Ti or an alloy thereof in place of Ni. Also, the electrode 7 for the i-layer 5 and the electrode 8 for the high-carrier density n+-layer 3 may be formed from any metal such as Ti, in place of Al, which permits ohmic contact.

The thus prepared light-emitting diode 10 was tested for luminous intensity and drive voltage by applying current (10 mA) across the electrodes. The results were compared with those of the conventional one having the Al layer formed directly on the i-layer 5, which gave a luminous intensity of 30 mcd. The results vary depending on the metal used for the undercoating of the electrode for the i-layer as shown in the table below. The data of luminous intensity and drive voltage are given in terms of index values compared with those of a conventional sample.

| Undercoating metal | Luminous intensity | Drive voltage | Light-emitting pattern |
| --- | --- | --- | --- |
| Ni | 1.5 | 0.82 | FIG. 5(b) |
| Ag | 1.4 | 0.90 | FIG. 5(c) |
| Ti | 1.05 | 0.95 | FIG. 5(d) |

It is noted that the light-emitting diode pertaining to the present invention has a higher luminous intensity and a lower drive voltage than conventional diodes.

Example 2

Figure 6:
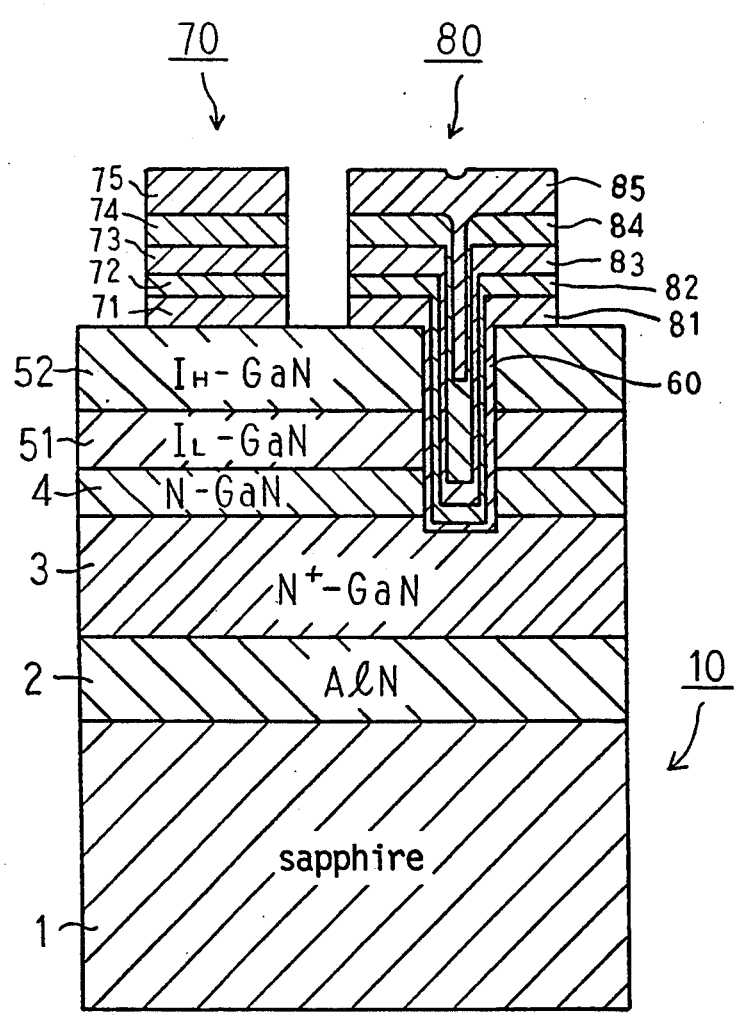
FIG. 6 is a vertical sectional view showing the structure of the light-emitting diode pertaining to a second embodiment of the present invention.

A light-emitting diode was prepared in the same manner as in Example 1. As shown in FIG. 6, it is composed of a sapphire substrate 1, a buffer layer 2 of AlN, a high-carrier density n+-layer 3 of GaN, a low-carrier density n-layer 4 (1.1 μm thick) having a carrier density of $1 \times 10^{15}/cm^3$, a low-impurity density $i_L$-layer 51 (1.1 μm thick) having a Zn density of $2 \times 10^{18}/cm^3$, and a high-impurity density $i_H$-layer 52 (0.2 μm thick) having a Zn density of $1 \times 10^{20}/cm^3$. It should be noted that the i-layer is of dual structure with 51 and 52.

A hole 60 was formed which penetrates the high-impurity density $i_H$ layer 52, the low-impurity density $i_L$ layer 51, and the low-carrier density n-layer 4, reaching the high-carrier density n+-layer 3. In this hole 60 was formed an electrode 80 for the high-carrier density n+-layer 3. An electrode 70 was also formed for the high-impurity density $i_H$-layer 52.

The electrode 70 is composed of a first Ni layer 71 (100 Å thick), a second Ni layer 72 (1000 Å thick), an Al layer 73 (1500 Å thick), a Ti layer 74 (1000 Å thick), and a third Ni layer 75 (2500 Å thick). The electrode 80 is also composed of a first Ni layer 81 (100 Å thick), a second Ni layer 82 (1000 Å thick), an Al layer 83 (1500 Å thick), a Ti layer 84 (1000 Å thick), and a third Ni layer 85 (2500 Å thick).

The first Ni layer 71 (81) was formed by vacuum deposition at 225° C. The second Ni layer 72 (82) was also formed by vacuum deposition with heating. (The two steps were separated by an interval in which the vacuum chamber was opened and the water was conditioned at normal pressure and normal temperature.) The Al layer 73 (83), Ti layer 74 (84), and third Ni layer 75 (85) were formed successively by vacuum deposition. The Al layer 73 (83) and Ti layer 74 (84) permit a solder bump to be formed on the third Ni layer 75 (85).

The thus prepared light-emitting diode has a drive voltage for light emission which is 0.8 times that of a conventional diode having an aluminum electrode. In addition, it also exhibits a luminous intensity of 150 mcd at 10 mA current, which is 1.5 times that (100 mcd) of the conventional diode having an aluminum electrode.

It was also found that the same result as mentioned above is obtained even in the case where the electrode 70 for the high-impurity density $i_H$-layer 52 is made of Ni in multi-layer structure and the electrode 80 for the high-carrier density n+-layer 3 is made of aluminum in single-layer structure.

Example 3

Figure 7:
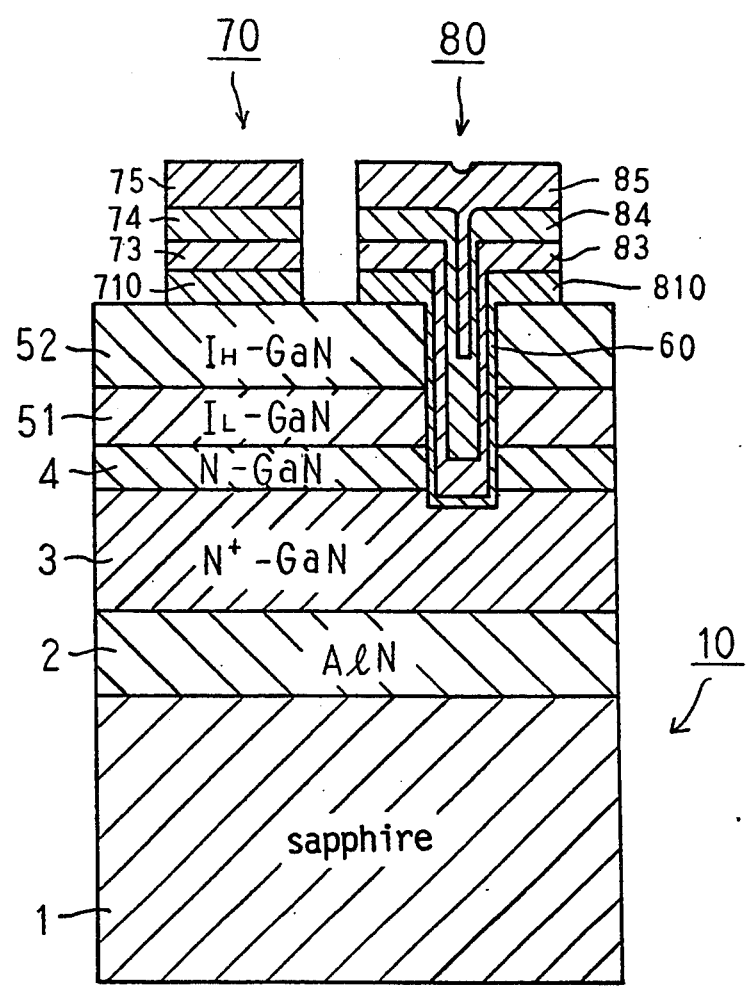
FIG. 7 is a vertical sectional view showing the structure of the light-emitting diode pertaining to yet a further embodiment of the present invention.
Figure 8:
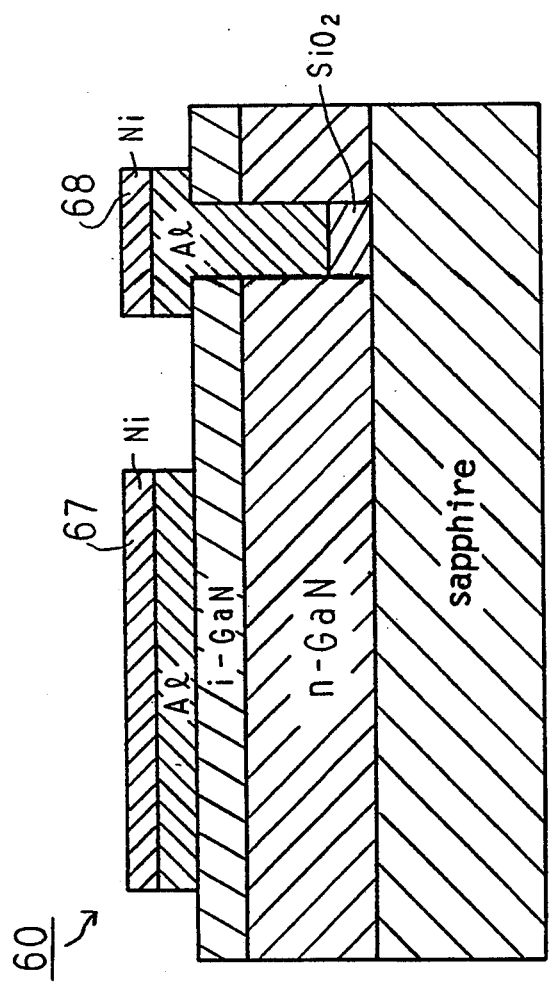
FIG. 8 is a vertical sectional view showing the structure of a conventional light-emitting diode.

The light-emitting diode in this example differs from that in the previous example in that the first Ni layer 71 (81) and second Ni layer 72 (82) are replaced by a Ni layer 710 (810) of single-layer structure, which is 300 Å thick, as shown in FIG. 7. This difference in structure has nothing to do with its performance. The Ni layer 710 (810) should preferably have a thickness in the range of 50 Å to 3000 Å. With a thickness lower than specified, it will be subject to attack by solder when a solder bump is formed. With a thickness greater than specified, it causes the light source to be localized near the electrode rather than the center and it is liable to peeling at the time of soldering in a solder bath.

What is claimed is:

1. A light-emitting device of gallium nitride compound semiconductor material comprising:

an n-layer of n-type gallium nitride compound semiconductor material ($Al_xGa_{1-x}N$, $x \geq 0$); and an i-layer of i-type gallium nitride compound semiconductor material ($Al_xGa_{1-x}N$, $x \geq 0$) doped with a p-type impurity;

wherein a first electrode layer including Ni is formed in contact with said i-layer and functions as an electrode therefore; and wherein said first electrode layer is a multi-layer structure having a first Ni layer of predetermined thickness formed over said i-layer, a second Ni layer which is thicker than said first Ni layer and formed thereon, an Al layer formed over said second Ni layer, a Ti layer formed over said Al layer, and a third Ni layer which is thicker than said first Ni layer formed over said Ti layer.

2. A light-emitting device of gallium nitride compound semiconductor material comprising:

an n-layer of n-type gallium nitride compound semiconductor ($Al_xGa_{1-x}N$, $x \geq 0$) material; and an i-layer of i-type gallium nitride compound semiconductor ($Al_xGa_{1-x}N$, $x \geq 0$) material doped with a p-type impurity;

wherein each of said n-layer and said i-layer include respective electrodes formed on a same relative surface, the electrode for said i-layer being composed of at least one layer with each said at least one layer being made of one of Ni, Ag, Ti, an alloy including Ni, an alloy including Ag, and an alloy including Ti; and wherein the electrode for said i-layer has an over layer formed thereon which is made of one of Al and an alloy containing Al.

3. A light-emitting device of gallium nitride compound semiconductor, comprising:

at least two layers of gallium nitride compound semiconductor material ($Al_xGa_{1-x}N$, $x \geq 0$);

a first electrode layer for one layer of said at least two layers; and a second electrode layer for another of said at least two layers;

said first and second electrode layers provide an improved luminous intensity of said light-emitting device;

wherein at least one layer of said first and second electrode layers includes a contact layer made of one of Ni, Ag, an alloy including Ni, an alloy including Ag, and an alloy including Ti, said contact layer being directly contacted with any of said at least two layers of gallium nitride compound semiconductor material ($Al_xGa_{1-x}N$, $x \geq 0$).

4. A light-emitting device of gallium nitride compound semiconductor according to claim 3, wherein said contact layer of said first electrode layer is uniformly formed on a light emitting surface of said one layer, said one layer being an i-layer of semi-insulation doped with a p-type impurity and said another layer being an n-layer with n-type conduction.

5. A light-emitting device of gallium nitride compound semiconductor according to claim 3, wherein said second electrode layer includes a contact layer made of one of Ni, Ag, an alloy including Ni, an alloy including Ag, and an alloy including Ti, said contact layer being directly contacted with said another layer and said another layer being an n-layer with n-type conduction.

6. A light-emitting device of gallium nitride compound semiconductor according to claim 3, wherein said first electrode layer is a multi-layer structure having a first Ni layer of predetermined thickness formed over said one layer, a second Ni layer which is thicker than said first Ni layer and formed thereon, an Al layer formed over said second Ni layer, a Ti layer formed over said Al layer, and a third Ni layer which is thicker than said first Ni layer formed over said Ti layer.

7. A light-emitting device of gallium nitride compound semiconductor according to claim 3, wherein at least one layer of said first and second electrode layers has an over layer which is made of one of Ni, Ag, Ti, an alloy including Ni, an alloy including Ag, and an alloy including Ti.

8. A light-emitting device of gallium nitride compound semiconductor material according to claim 4, wherein at least one layer of said first and second electrode layers has an over layer which is made of one of Ni, Ag, Ti, an alloy including Ni, an alloy including Ag, and an alloy including Ti.

9. A light-emitting device of gallium nitride compound semiconductor according to claim 3, wherein at least one layer of said first and second electrode layers has over layer formed thereon which is made of one of Al and an alloy containing Al.

10. A light-emitting device of gallium nitride compound semiconductor according to claim 4, wherein at least one layer of said first and second electrode layers has over layer formed thereon which is made of one of Al and an alloy containing Al.

11. A light-emitting device of gallium nitride compound semiconductor according to claim 7, wherein at least one layer of said first and second electrode layers has over layer formed thereon which is made of one of Al and an alloy containing Al.

12. A light-emitting device of gallium nitride compound semiconductor according to claim 8, wherein at least one layer of said first and second electrode layers has over layer formed thereon which is made of one of Al and an alloy containing Al.

13. A light-emitting device of gallium nitride compound semiconductor according to claim 4, wherein said second electrode layer is made of one of Al and an alloy containing Al, and said first electrode has an over layer which is made of one of Ni, Ag, Ti, an alloy including Ni, an alloy including Ag, and an alloy including Ti.

14. A light-emitting device of gallium nitride compound semiconductor material according to claim 4, wherein said first electrode layer is a multi-layer structure having a first Ni layer of predetermined thickness formed over said i-layer, a second Ni layer which is thicker than said first Ni layer and formed thereon, an Al layer formed over said second Ni layer, a Ti layer formed over said Al layer, and a third Ni layer which is thicker than said first Ni layer formed over said Ti layer.

* * * * *